US012754801B2

(12) United States Patent
Park et al.

(10) Patent No.: US 12,754,801 B2
(45) Date of Patent: Oct. 6, 2026

(54) MEMORY DEVICE, MEMORY CONTROLLER, AND STORAGE DEVICE INCLUDING THE SAME

(71) Applicant: Samsung Electronics Co., Ltd., Suwon-si (KR)

(72) Inventors: Jungho Park, Suwon-si (KR); Beomkyu Shin, Suwon-si (KR); Myungkyu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/785,327

(22) Filed: Jul. 26, 2024

(65) Prior Publication Data

US 2025/0181450 A1 Jun. 5, 2025

(30) Foreign Application Priority Data

Nov. 30, 2023 (KR) ........................ 10-2023-0171823

(51) Int. Cl.
*G06F 11/00* (2006.01)
*G06F 11/07* (2006.01)
*G06F 11/10* (2006.01)
*G11C 7/10* (2006.01)

(52) U.S. Cl.
CPC ...... *G06F 11/1068* (2013.01); *G06F 11/0778* (2013.01); *G11C 7/106* (2013.01)

(58) Field of Classification Search
CPC .. G06F 11/1068; G06F 11/00; G06F 11/0778; H03M 13/09; G11C 7/106; G11C 29/52
See application file for complete search history.

(56) References Cited

U.S. PATENT DOCUMENTS

| | | | | |
|---|---|---|---|---|
| 8,861,267 | B2 * | 10/2014 | Seol | G11C 11/5628 365/185.11 |
| 9,183,140 | B2 | 11/2015 | Werner et al. | |
| 10,061,641 | B2 | 8/2018 | Kim et al. | |
| 10,372,539 | B2 * | 8/2019 | Avraham | H03M 13/1154 |
| 10,970,170 | B2 * | 4/2021 | Parry | G06F 3/064 |
| 11,126,545 | B2 * | 9/2021 | Kim | G06F 12/0246 |
| 11,436,083 | B2 * | 9/2022 | Jain | G06F 11/1072 |
| 11,527,300 | B2 | 12/2022 | Yang et al. | |
| 11,599,268 | B2 * | 3/2023 | Kim | G06F 11/1068 |
| 11,722,158 | B2 | 8/2023 | Saliba | |
| 11,829,244 | B2 * | 11/2023 | Kim | G06F 11/1451 |
| 11,853,160 | B2 * | 12/2023 | Avraham | G06F 11/1068 |

(Continued)

FOREIGN PATENT DOCUMENTS

| | | | |
|---|---|---|---|
| JP | 7407230 | B2 | 12/2023 |
| KR | 10-2108386 | B1 | 5/2020 |

*Primary Examiner* — Esaw T Abraham
(74) *Attorney, Agent, or Firm* — Muir Patent Law, PLLC

(57) ABSTRACT

A memory device includes a memory cell array including a first memory region storing first data, a page buffer including a first latch configured to store data dumped from the memory cell array, and a control logic circuit configured to receive parity adjustment information from an external device and control an operation of the memory cell array. The first data includes first user data and first parity data including parity bits generated based on the first user data, and the control logic circuit dumps first parity data of which a size is adjusted based on the parity adjustment information to the first latch.

17 Claims, 12 Drawing Sheets

(56) References Cited

U.S. PATENT DOCUMENTS

| | | | | |
|---|---|---|---|---|
| 12,141,466 | B2 * | 11/2024 | Magnavacca | G06F 11/108 |
| 12,353,281 | B2 * | 7/2025 | Zhang | G06F 11/0772 |
| 2009/0319840 | A1 * | 12/2009 | Hara | G06F 11/1068<br>714/E11.169 |
| 2023/0161666 | A1 | 5/2023 | Zamir et al. | |

* cited by examiner

MEMORY DEVICE, MEMORY CONTROLLER, AND STORAGE DEVICE INCLUDING THE SAME

CROSS-REFERENCE TO RELATED APPLICATION(S)

This application is based on and claims priority under 35 USC § 119 to Korean Patent Application No. 10-2023-0171823, filed on Nov. 30, 2023, in the Korean Intellectual Property Office, the disclosure of which is incorporated by reference herein in its entirety.

BACKGROUND

The present invention relates to a storage device, and more particularly, to a memory device that variably controls parity data, a memory controller, and a storage device including the same.

The performance of storage devices based on a nonvolatile memory device may be significantly affected by an input/output (I/O) occupancy time based on an internal operation of the nonvolatile memory device. The internal operation of a nonvolatile memory device may refer to an operation that is invisible to users. An example of the internal operation of a nonvolatile memory device may include an operation to correct error bits to improve data I/O reliability of storage devices.

Storage devices may perform a correction operation on error bits, based on parity data. Here, storage devices may perform a correction operation on user data by maintaining a designated format and order of parity data. However, the fact that the storage devices have to perform correction operations according to the designated format and order of the parity data may result in an increase in the I/O occupancy time for the nonvolatile memory device, which may degrade the overall performance of the storage device.

SUMMARY

The inventive concept provides a storage device in which an I/O occupancy rate for a nonvolatile memory device is reduced by variably adjusting parity data in correcting error bits, thereby having improved performance.

The technical problems of the inventive concept are not limited to the technical problems mentioned above, and other technical problems not mentioned may be clearly understood by those skilled in the art from the description below.

According to an aspect of the inventive concept, there is provided a memory device including a memory cell array including a first memory region storing first data, a page buffer connected to the memory cell array and including a first latch configured to store data read from the memory cell array, and a control logic circuit configured to receive parity adjustment information from an external device and control an operation of the memory cell array. The first data includes first user data and first parity data including parity bits generated based on the first user data, and the control logic circuit adjusts a size of the first parity data based on the parity adjustment information and dumps the adjusted first parity data to the first latch.

According to another aspect of the inventive concept, there is provided a memory controller including an error correction code engine configured to generate parity data corresponding to user data received from a host and a parity controller including information indicating reliability of a plurality of memory regions included in a memory device. The parity controller adjusts a size of the parity data based on reliability information corresponding to a memory region in which the user data is stored among the plurality of memory regions, and the memory controller writes the adjusted parity data and the user data to the memory device.

According to another aspect of the inventive concept, there is provided a storage device including a memory device configured to adjust a size of first parity data based on parity adjustment information and output the first parity data having the adjusted size and a memory controller configured to control an operation of the memory device. The memory device includes a memory cell array including a plurality of memory regions, a page buffer connected to the memory cell array and including a first latch configured to store data read from the memory cell array, and a control logic circuit configured to receive the parity adjustment information from the memory controller and control an operation of the memory cell array. The memory controller includes a parity controller including information indicating reliability of the plurality of memory regions included in the memory device. The parity controller is configured to determine a format and size of the first parity data based on reliability information of a memory region in which user data corresponding to the first parity data is stored, and provide the parity adjustment information indicating the determined format and size of the first parity data to the memory device.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
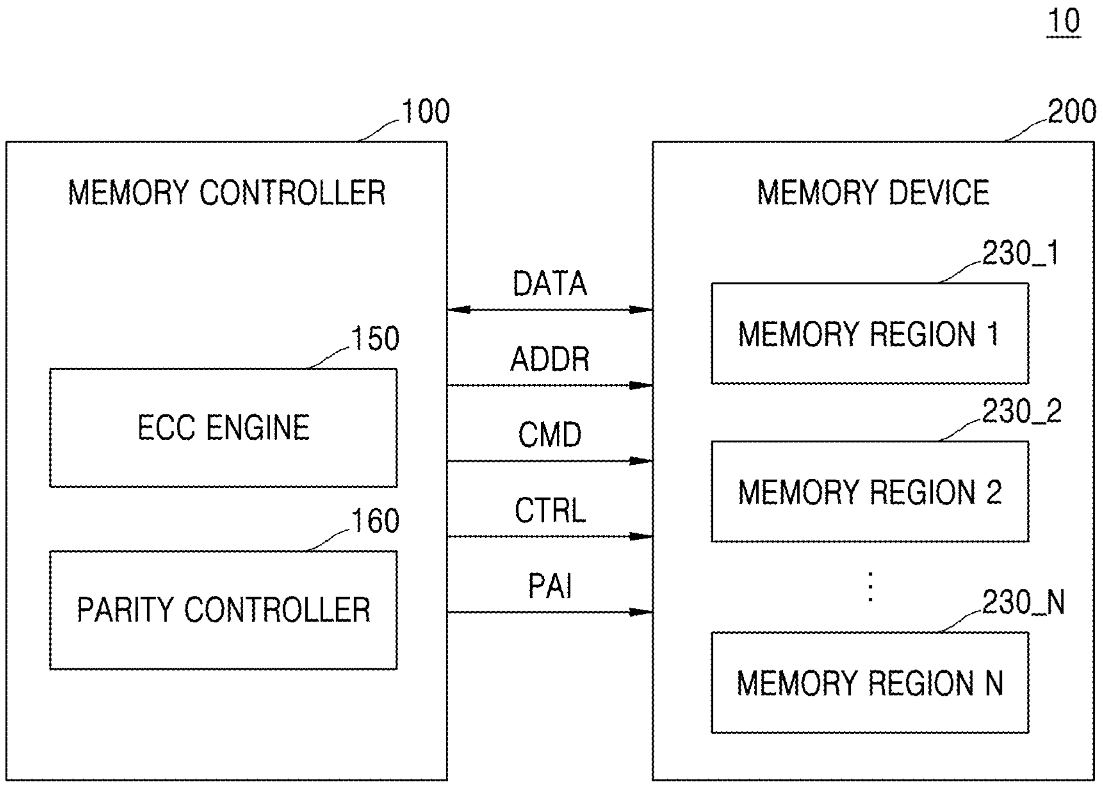
FIG. 1 is a block diagram illustrating a storage device according to an embodiment.

Hereinafter, embodiments are described in detail with reference to the accompanying drawings. In describing with reference to the drawings, identical or corresponding components are given the same reference numerals and redundant descriptions thereof are omitted.

FIG. 1 is a block diagram illustrating a storage device 10 according to an embodiment.

The storage device 10 may include storage mediums for storing data according to a request from a host. For example, the storage device 10 may include at least one of a solid state drive (SSD), an embedded memory, and a removable external memory. If the storage device 10 is an SSD, the storage device 10 may be a device that follows a nonvolatile memory express (NVMe) standard.

If the storage device 10 is an embedded memory or an external memory, the storage device 10 may be a device that follows the universal flash storage (UFS) or embedded multi-media card (eMMC) standard. The host and the storage device 10 may each generate packets according to an adopted standard protocol and transmit the packets. In an embodiment, the storage device 10 may be an embedded memory built into the storage device 10. For example, the storage device 10 may be an eMMC or an embedded UFS memory device. In an embodiment, the storage device 10 may be an external memory that is removable from another system. For example, the storage device 10 may include a UFS memory card, compact flash (CF), secure digital (SD), micro-SD, mini-SD, extreme digital (xD), or memory stick.

Referring to FIG. 1, the storage device 10 may include a memory controller 100 and a memory device 200.

The memory controller 100 may include an error correction code (ECC) engine 150 and a parity controller 160. The memory controller 100 may control read, write, and erase operations for the memory device 200 by providing an address ADDR, a command CMD, and a control signal CTRL to the memory device 200. In an embodiment, in response to a read/write request from the host HOST, the memory controller 100 may read data stored in the memory device 200 or control the memory device 200 to write data to the memory device 200. In an embodiment, the storage device 10 may perform operations, such as wear leveling management, bad block management, and garbage collection, and for these operations, the memory controller 100 may provide the address ADDR, the command CMD, the control signal CTRL, and data DATA to the memory device 200.

The data DATA may be transmitted and received between the memory controller 100 and the memory device 200. In an embodiment, the data DATA may include user data and parity data. The parity data may be data used by the ECC engine 150 to perform an error correction operation. The parity data may be generated by the ECC engine 150. The parity data may be data generated based on user data.

The ECC engine 150 may be configured to detect and correct errors in data read from the memory device 200 using an ECC. In addition, the ECC engine 150 may generate parity data related to user data to be written to the memory device 200 and write the user data and parity data to the memory device 200. In an embodiment, the ECC engine 150 may include a circuit, system, or device for error correction.

The parity controller 160 may provide parity adjustment information PAI to the memory device 200 during a read operation of a first memory region 230_1 to an N-th memory region 230_N (N is a natural number of 2 or greater) based on reliability information on the first memory region 230_1 to the N-th memory region 230_N. In addition, the parity controller 160 may adjust the size of parity data of data to be written during a write operation of the first memory region 230_1 to the N-th memory region 230_N based on the reliability information for the first memory region 230_1 to the N-th memory region 230_N.

A memory cell array of the memory device 200 may be divided into a plurality of memory regions. The memory regions may include the first memory region 230_1 to the N-th memory region 230_N. In this disclosure, the memory regions may refer to regions including a plurality of memory cells in the memory cell array.

The reliability of each of the memory regions 230_1 to 230_N included in the memory device 200 may deteriorate due to various causes. For example, the criteria for determining the reliability of the memory regions may include at least one of read count information, program count information, post-erase elapsed time information, and cell temperature information related to each memory region.

In an embodiment, the reliability of each memory region may be different, and accordingly, parity adjustment information PAI provided by the memory controller 100 to the memory device 200 may also be different. For example, the reliability of the first memory region 230_1 may be different from that of the second memory region 230_2. Accordingly, the parity adjustment information PAI provided by the memory controller 100 to the memory device 200 may vary depending on whether the data to be read is read from the first memory region 230_1 or the second memory region 230_2.

In an embodiment, when the memory controller 100 reads data from the memory device 200, the memory controller 100 may provide the parity adjustment information PAI to the memory device 200. The memory device 200 may adjust the format and size of parity data related to data to be read based on the parity adjustment information PAI. The memory device 200 may provide data DATA with the format and size of the parity data adjusted to the memory controller 100. A detailed description thereof is provided below with reference to FIGS. 6A to 6D.

In an embodiment, when the memory controller 100 writes data received from the host to the memory device 200, the format and size of the parity data related to the data to be written may be adjusted based on the reliability of the memory region in which the data to be written is stored. The memory controller 100 may provide the data DATA with the format and size of the parity data adjusted to the memory device 200. A detailed description thereof will be given below with reference to FIG. 7.

When reading data stored in the memory device 200, the storage device 10 according to an embodiment may perform an error correction operation based on the parity data. The memory device 200 may variably adjust the parity data based on the parity adjustment information PAI provided from the memory controller 100. In addition, when writing data to the memory device 200, the storage device 10 may variably adjust the format and size of the parity data generated in response to user data and write the user data and the adjusted parity data to the memory device 200. By adjusting the parity data in this manner, the speed of data input/output (I/O) operation from the memory device 200 may increase and the performance of the storage device 10 may be improved.

Figure 2:
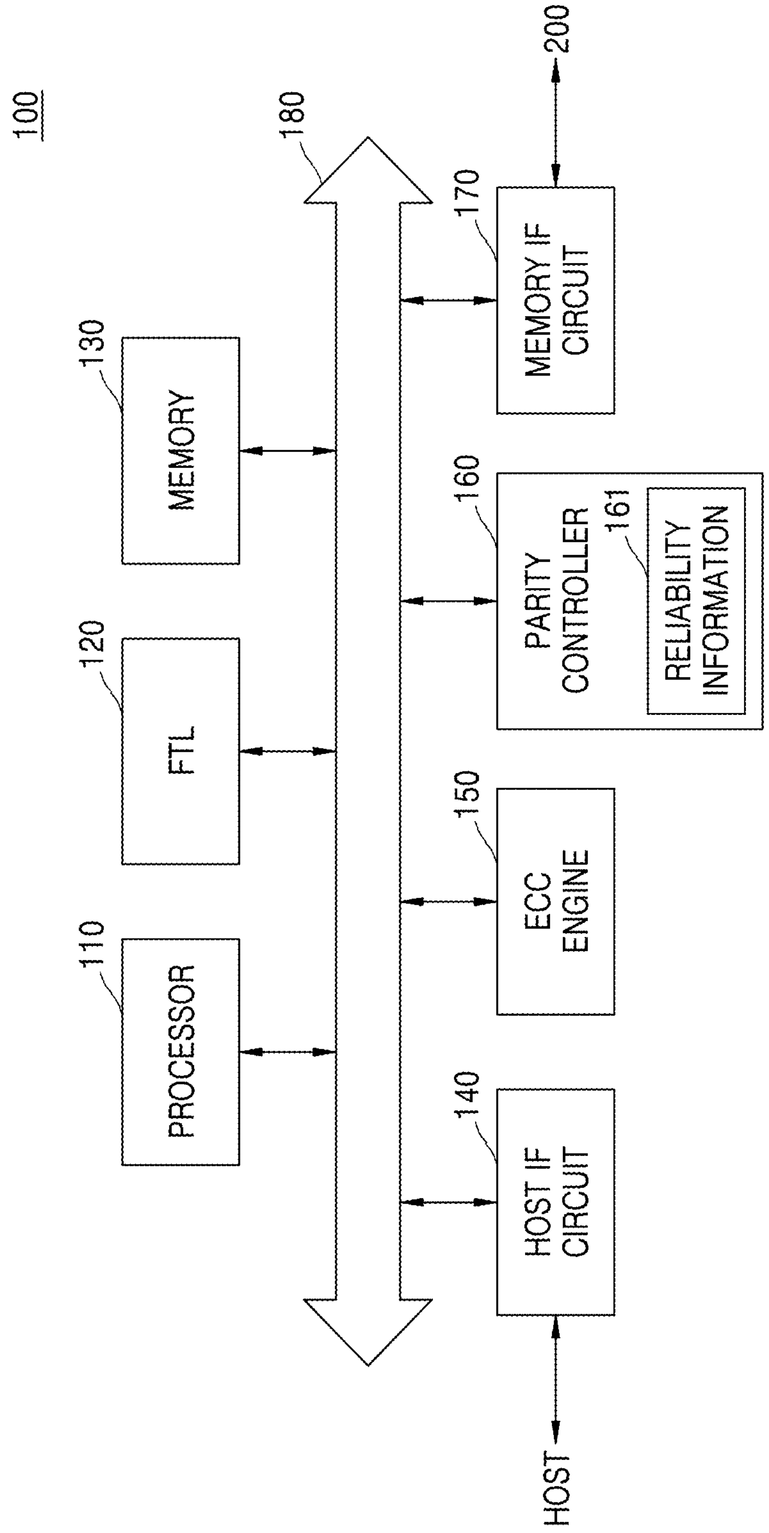
FIG. 2 is a block diagram illustrating a memory controller according to an embodiment.

FIG. 2 is a block diagram illustrating a memory controller 100 according to an embodiment. FIG. 2 may be described with reference to FIG. 1, and redundant descriptions may be omitted.

Referring to FIG. 2, the memory controller 100 may include a processor 110, a flash translation layer (FTL) 120, a memory 130, a host interface (IF) circuit 140, an ECC engine 150, and a memory IF circuit 170, and these components may communicate with each other through a bus 180.

The processor 110 may include a central processing unit (CPU) or a microprocessor and may control the overall operation of the memory controller 100. The processor 110 may include one or more processor cores capable of executing an instruction set of program code configured to perform a specific operation. For example, the processor 110 may execute command codes of firmware stored in the memory 130.

The FTL 120 may perform various functions, such as address mapping, wear-leveling, and garbage collection.

The memory 130 may be used as an operating memory, buffer memory, cache memory, etc. For example, the memory 130 may be implemented as dynamic random access memory (DRAM), static random access memory (SRAM), phase-change random access memory (PRAM), or flash memory.

The host IF circuit 140 may provide an interface between a host HOST and the memory controller 100. For example, the host IF circuit 140 may provide an interface according to universal serial bus (USB), MMC, peripheral component interconnect-express (PCI-E), advanced technology attachment (ATA), serial ATA (SATA), parallel ATA (PATA), small computer system interface (SCSI), serial attached SCSI (SAS), enhanced small disk interface (ESDI), and integrated drive electronics (IDE). The host IF circuit 140 may receive requests and data from the host HOST and output data to the host HOST.

The ECC engine 150 may perform error detection and correction functions on read data from the memory device 200. In detail, the ECC engine 150 may generate parity bits for write data to be provided to the memory device 200, and the generated parity bits may be stored in the memory device 200 together with the write data. When reading data from the memory device 200, the ECC engine 150 may correct errors in read data using the parity bits read from the memory device 200 together with the read data and outputs error-corrected read data.

The parity controller 160 may include reliability information 161. In detail, the parity controller 160 may include the reliability information 161 for the first memory region 230_1 to the N-th memory region 230_N generated based on a reliability judgment criteria for the memory region. For example, the reliability information 161 may include information indicating the reliability of the first memory region 230_1. In some embodiments, the reliability information 161 may be stored in the memory 130.

The parity controller 160 may generate the parity adjustment information PAI based on the reliability information 161. When performing an operation of reading data from the memory device 200, the parity controller 160 may generate the parity adjustment information PAI based on the reliability information 161. The parity adjustment information PAI may include parity data format information that determines the format of parity data related to data read from the memory device 200 and parity data size information that determines the size of the parity data.

In an embodiment, when the reliability information for the first memory region 230_1 is a first reference value, the parity adjustment information PAI may include parity data format information indicating that the format of the parity data is a first format. In this disclosure, the first reference value indicating the reliability information of the memory region may refer to a reference value for explaining a case in which high error correction capability is required when performing an error correction operation of the memory controller 100. Here, a case in which high error correction capability is required may refer to a case in which the reliability of the memory region from which data is read is low. One of the reasons of low reliability of the memory region may be that memory cells included in the memory region are deteriorated due to frequent read, write, and erase operations being performed on the memory region. Reading data from a deteriorated memory cell or writing data into a deteriorated memory cell may involve a higher error occurrence probability than in a non-deteriorated memory cell. Accordingly, the memory controller 100 may select a method of selecting parity data having the highest error correction capability through parity data format information indicating the first format. This is merely an example to aid understanding and is not intended to limit the inventive concept. A detailed description thereof is provided below with reference to FIG. 6A.

In an embodiment, when the reliability information for the first memory region 230_1 is a second reference value, the parity adjustment information PAI may include parity data format information indicating that the format of the parity data is a second format. In this disclosure, the second reference value indicating the reliability information of the memory region may refer to a reference value for explaining a case in which a faster I/O speed is required for data to be input to/output from the memory device 200 when performing an error correction operation of the memory controller 100. Here, a case in which a faster I/O speed is required may refer to a case in which the reliability of the memory region from which data is read is high. A case in which the reliability of the memory region is high may refer to a case in which the degree of deterioration of the memory cells included in the memory region is not high when many read, write, and erase operations are not performed on the memory region, unlike a case in which the reliability of the memory region is low. In this manner, reading data from a memory region in which the degree of deterioration is not high and writing data into such a memory region may have a relatively lower error occurrence probability than in a deteriorated memory cell. Accordingly, the memory controller 100 may optimize I/O performance by selecting and transmitting the most efficient parity according to the reliability of the memory region. This is merely an example to aid understanding and is not intended to limit the inventive concept. A detailed description thereof is provided below with reference to FIG. 6B.

In an embodiment, when the reliability information for the first memory region 230_1 is a third reference value, the parity adjustment information PAI may include parity data format information indicating that the format of the parity data is a third format. In this disclosure, reliability information being the third reference value may refer to that when the memory controller 100 performs an error correction operation, the error correction operation is performed based on new parity data that is different from existing parity data. Here, the new parity data may be generated based on user data.

During the error correction operation of the memory controller 100, if the error correction capability achievable through parity data configured in the first format or the second format is different from the range of error correction capability considered by the memory controller 100, the third format may be selected as a format of the parity data.

For example, it is assumed that, in an initial state after data is written to the memory region, the reliability of the memory region is very high. In this case, only parity data having a size less than the size of parity data having the lowest error correction capability previously considered in the related art may be required. That is, when performing a read operation by selecting the first format or the second format as the format of the parity data, parity data in a form with higher error correction capability than necessary (i.e., parity data having an unnecessarily large size) has to be transmitted, and thus, the operation of the memory device 200 may be inefficient in terms of I/O speed. Here, if the memory controller 100 selects the third format as the parity data and performs a read operation, the read operation may be performed using new parity data having a different format from and smaller size than the parity data of the first format and the second format, thereby achieving improved I/O speed. This is merely an example to aid understanding and is not intended to limit the inventive concept. A detailed description thereof is provided below with reference to FIG. 6C.

Also, for example, it is assumed that the error correction capability required for the memory controller 100 depending on the reliability of a memory region falls between a case of selecting the first format and performing a read operation and a case of selecting the second format. In this situation, if the memory controller 100 selects the first format, parity data having a high error correction capability (i.e., parity data having an unnecessarily large size) compared to the required error correction capability, which may be inappropriate, and if the memory controller 100 selects the second format, there may be a high possibility that error correction may fail, which may also be inappropriate. Here, if the memory controller 100 selects the third format as the parity data and performs a read operation, the memory controller 100 may perform a read operation based on all or part of the newly generated parity data and the existing parity data together received from the memory device 200, and thus, a target error correction reliability may be achieved. This is merely an example to aid understanding and is not intended to limit the inventive concept. A detailed description thereof is provided below with reference to FIG. 6D.

In an embodiment, the first to third reference values may be values previously input to the memory controller 100. Alternatively, the first to third reference values may be values determined by the FTL 120 to achieve a certain level of error correction capability or higher in relation to error correction operations during the process of reading data from the memory device 200.

When performing a data write operation in the memory device 200, the parity controller 160 may determine the format and size of the parity data of the data to be written based on the reliability information 161.

In an embodiment, when the reliability information for the first memory region 230_1 is a first write reference value, the memory controller 100 may determine the format of the parity data of the data to be written as a first write format. In some embodiments, the first write reference value may be different from the first reference value in the read operation described above. In this disclosure, the first write reference value indicating the reliability information of a memory region may be a reference value for explaining a case in which the memory controller 100 generates parity data corresponding to user data when reliability of a memory region to which data is written is low. The first write format may be a parity data format that has superior error correction capability to a second write format. A detailed description thereof is provided below with reference to FIG. 7.

In an embodiment, when the reliability information for the first memory region 230_1 is a second write reference value, the memory controller 100 may determine the format of the parity data of the data to be written as a second write format. In some embodiments, the second write reference value may be different from the second reference value in the read operation described above. In this disclosure, the second write reference value indicating the reliability information of a memory region may be a reference value for explaining a case in which the memory controller 100 generates parity data corresponding to user data when reliability of a memory region to which data is written is high. The second write format may be a parity data format that is more efficient than the first write format in terms of I/O performance of the memory device 200. A detailed description thereof is provided below with reference to FIG. 7.

In an embodiment, the first write reference value and the second write reference value may be values previously input to the memory controller 100. Alternatively, the first write reference value and the second write reference value may be values determined by the FTL 120 to achieve error correction capability above a certain level in consideration of the reliability of a memory region at the time the data is written in the process of writing data to the memory device 200.

The parity controller 160 may be implemented in hardware, software, or firmware. When the parity controller 160 is implemented in software or firmware, the parity controller 160 may be loaded into the memory 130 and operate under control by the processor 110. In some embodiments, the parity controller 160 may be included in the FTL 120 but is not limited thereto.

The memory IF circuit 170 may provide an interface between the memory controller 100 and the memory device 200. For example, data, commands, and addresses may be transmitted and received between the memory controller 100 and the memory device 200 through the memory IF circuit 170.

The bus 180 may operate based on one of various bus protocols. The various bus protocols may include at least one of advanced microcontroller bus architecture (AMBA) protocol, USB protocol, MMC protocol, PCI protocol, PCI-E protocol, ATA protocol, Serial-ATA protocol, Parallel-ATA protocol, SCSI protocol, ESDI protocol, integrated drive electronics (ESDI) protocol, mobile industry processor interface (MIPI) protocol, and UFS protocol.

Figure 3:
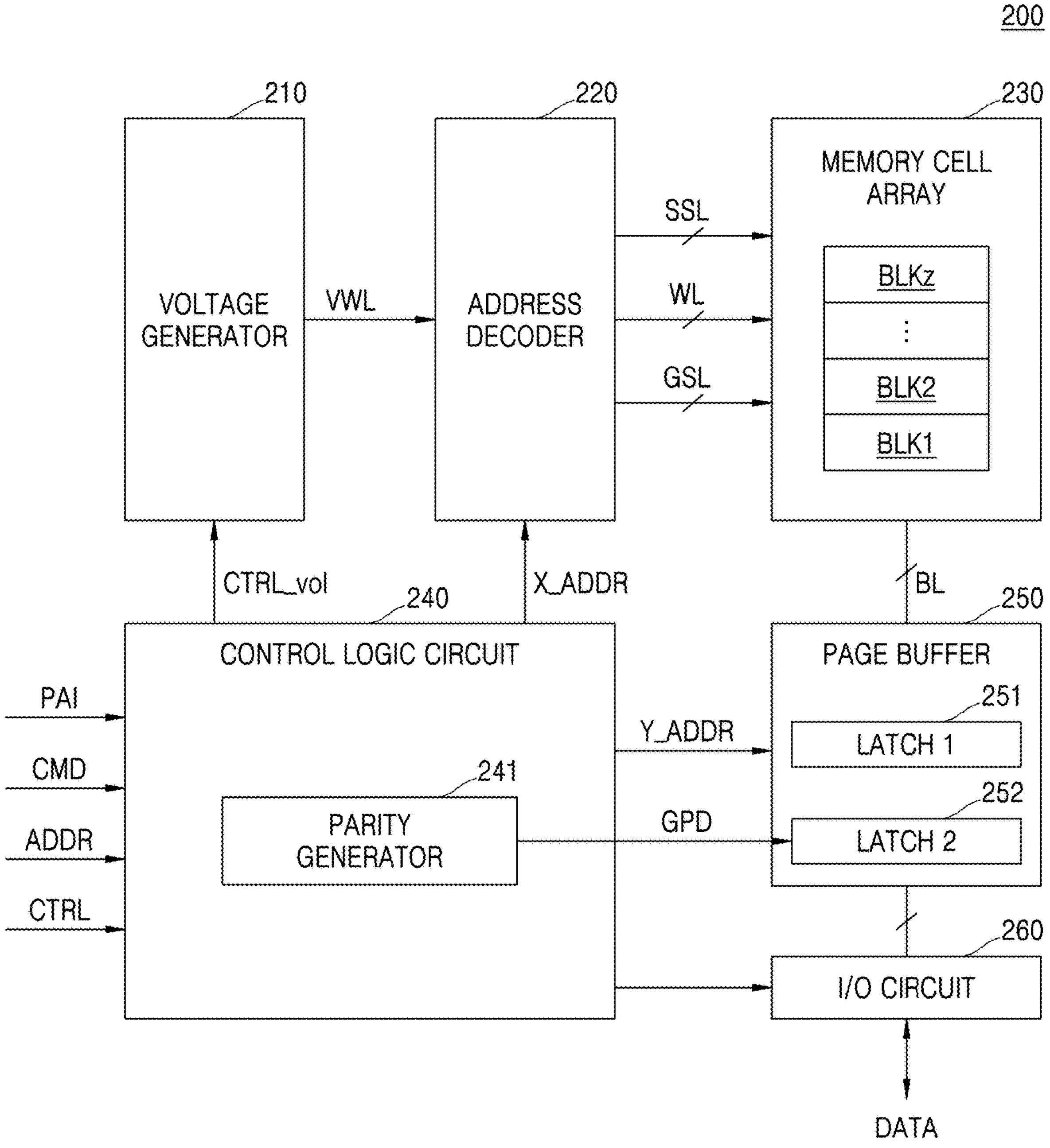
FIG. 3 is a block diagram illustrating a memory device according to an embodiment.

FIG. 3 is a block diagram illustrating the memory device 200 according to an embodiment. FIG. 3 may be described with reference to FIGS. 1 and 2, and redundant descriptions may be omitted.

Referring to FIG. 3, the memory device 200 includes a voltage generator 210, an address decoder 220, a memory cell array 230, a control logic circuit 240, a page buffer 250, and an I/O circuit 260.

The voltage generator 210 may generate various types of voltages to perform program, read, and erase operations on the memory cell array 230 based on a voltage control signal CTRL_vol. In detail, the voltage generator 210 may generate a word line voltage VWL, for example, a program voltage, a read voltage, a pass voltage, an erase verification voltage, or a program verification voltage. In addition, the voltage generator 210 may generate a string select line voltage and a ground select line voltage based on the voltage control signal CTRL_vol. In addition, the voltage generator 210 may generate an erase voltage to be provided to the memory cell array 230.

The address decoder 220 may select one of a plurality of memory blocks BLK1 to BLKz (z is a natural number greater than 1) of the memory cell array 230, select one of word lines WL of the selected memory block, and select one of a plurality of string select lines SSL.

The memory cell array 230 may be connected to word lines WL, string select lines SSL, ground select lines GSL, and bit lines BL. The memory cell array 230 may be connected to the address decoder 220 through word lines WL, string select lines SSL, and ground select lines GSL and may be connected to the page buffer 250 through bit lines BL. The memory cell array 230 may include the memory blocks BLK1 to BLKz.

Each of the memory blocks BLK1 to BLKz may include a plurality of memory cells and a plurality of selection transistors. The memory cells may be connected to the word lines WL, and the selection transistors may be connected to string select lines SSL or ground select lines GSL. Each of the memory blocks BLK1 to BLKz may correspond to an erase unit. Each of the memory blocks BLK1 to BLKz may include a plurality of pages, and each of the pages may correspond to a program or read unit of data in one memory block. In an embodiment, each of the memory blocks BLK1 to BLKz may correspond to the first to N-th memory regions 230_1 to 230_N of FIG. 1.

The control logic circuit 240 may output various control signals to perform program, read, and erase operations on the memory cell array 230 based on the command CMD, address ADDR, and control signal CTRL. The control logic circuit 240 may provide a row address X-ADDR to the address decoder 220, a column address Y-ADDR to the page buffer 250, and a voltage control signal CTRL_vol to the voltage generator 210.

The control logic circuit 240 may include a parity generator 241. The control logic circuit 240 may generate new parity data based on the parity adjustment information PAI received from the memory controller 100. The parity data newly generated by the parity generator 241 may be referred to as generated parity data GPD. The parity generator 241 may provide the generated parity data GPD to a second latch 252 of the page buffer 250.

In an embodiment, when the parity adjustment information PAI includes parity data format information indicating that the format of the parity data is the third format, the parity generator 241 may generate parity data GPD that is different from parity data corresponding to read data.

The page buffer 250 may include a first latch 251 and the second latch 252. During a read operation of the memory device 200, the page buffer 250 may sense a bit line BL of a selected memory cell under control by the control logic circuit 240. Sensed data may be dumped into the first latch 251 and the second latch 252 provided inside the page buffer 250. The page buffer 250 may provide data latched in the first latch 251 and the second latch 252 to the I/O circuit 260 under control by the control logic circuit 240. During a write operation of the memory device 200, write data provided from the memory controller 100 may be dumped into the first latch 251 provided inside the page buffer 250. The page buffer 250 may provide data latched in the latches to the memory cell array 230 under control by the control logic circuit 240.

In an embodiment, when the memory device 200 performs a read operation, parity data may be dumped to the first latch 251 or the second latch 252 according to the parity data format information included in the parity adjustment information PAI. A detailed description thereof is given below with reference to FIGS. 6A to 6D.

The I/O circuit 260 may temporarily store the command CMD, address ADDR, control signal CTRL, and data DATA provided from the outside of the memory device 200. The I/O circuit 260 may temporarily store the read data of the memory device 200 and output the data DATA to the outside at a designated time. In addition, the I/O circuit 260 may temporarily store write data provided from the outside and provide data DATA to the page buffer 250 at a designated time.

Figure 4:
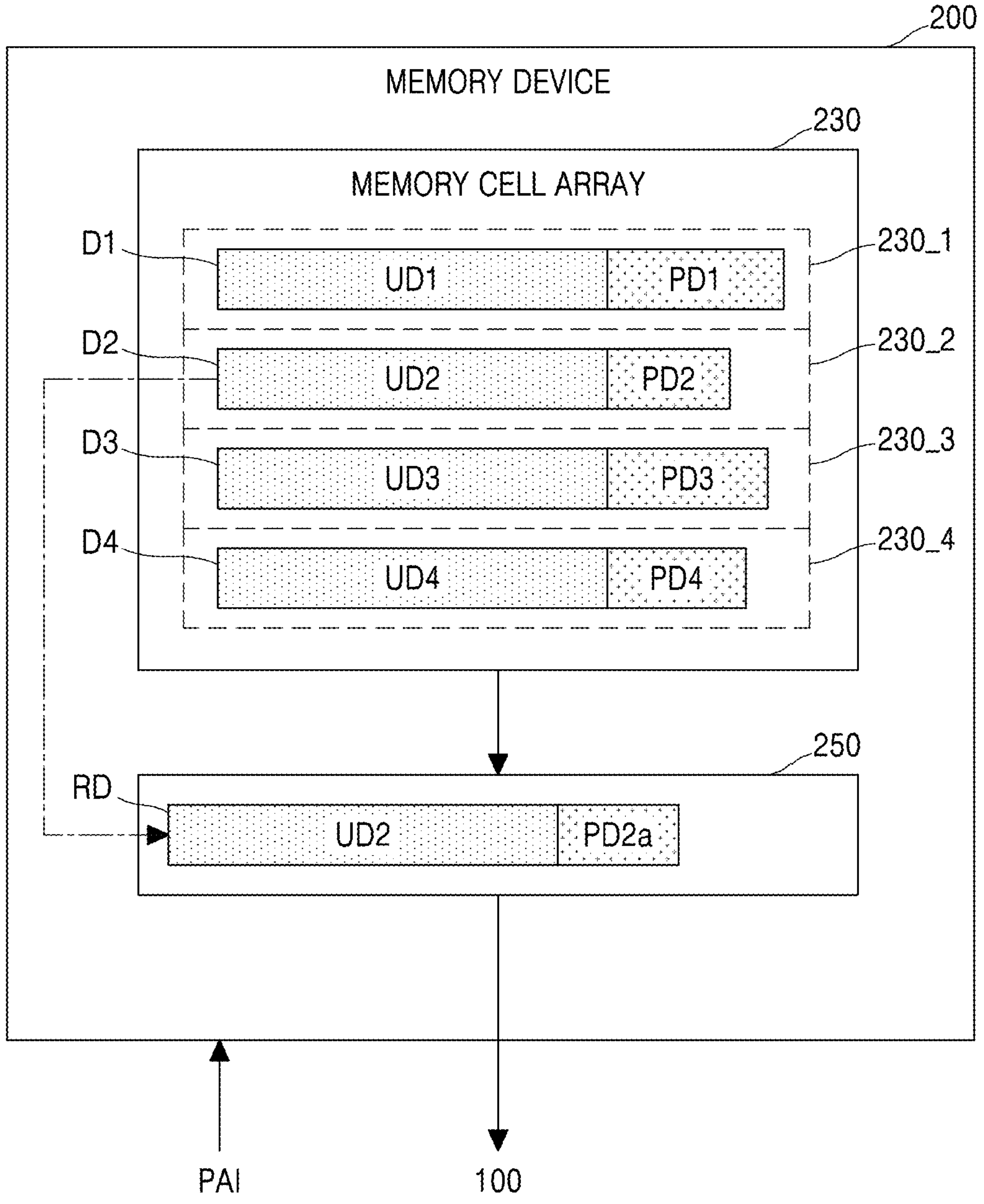
FIG. 4 is a block diagram illustrating a read operation of a memory device according to an embodiment.

FIG. 4 is a block diagram illustrating a read operation of the memory device 200 according to an embodiment. In detail, FIG. 4 is a diagram illustrating the memory controller 100 that reads second data D2 from the memory device 200. FIG. 4 may be described with reference to FIGS. 1 to 3, and redundant descriptions may be omitted.

Referring to FIG. 4, the memory device 200 may include the memory cell array 230 and the page buffer 250. The memory cell array 230 may include a first memory region 230_1 to a fourth memory region 230_4. In FIG. 4, the memory cell array 230 is illustrated as including four memory regions, but this is an example and the memory cell array 230 may include fewer or more memory regions.

First data D1 may be stored in the first memory region 230_1. The first data D1 may include first user data UD1 and first parity data PD1. The second data D2 may be stored in the second memory region 230_2. The second data D2 may include second user data UD2 and second parity data PD2. Third data D3 may be stored in the third memory region 230_3. The third data D3 may include third user data UD3 and third parity data PD3. Fourth data D4 may be stored in the fourth memory region 230_4. The fourth data D4 may include fourth user data UD4 and fourth parity data PD4.

In an embodiment, formats and sizes of the first to fourth parity data PD1 to PD4 may be different. The formats and sizes of the first to fourth parity data PD1 to PD4 may be determined based on reliability information corresponding to the memory region in which each parity data is stored.

In an embodiment, the memory device 200 may provide read data to the page buffer 250 during a read operation. For example, when the memory controller 100 reads the second data D2, the memory device 200 may provide the second data D2 to the page buffer 250. Read data RD stored in the page buffer 250 may include second user data UD2 and adjusted parity data PD2*a*. The adjusted parity data PD2*a* may have a different format and size from the second parity data PD2. The memory device 200 may provide the read data RD stored in the page buffer 250 to the memory controller 100. In an embodiment, the adjusted parity data PD2*a* may be generated based on the parity adjustment information PAI.

In an embodiment, the memory controller 100 may perform an error correction operation on the read data RD. In detail, the memory controller 100 may perform an error correction operation on the second user data UD2 based on the adjusted parity data PD2*a*.

Figure 5:
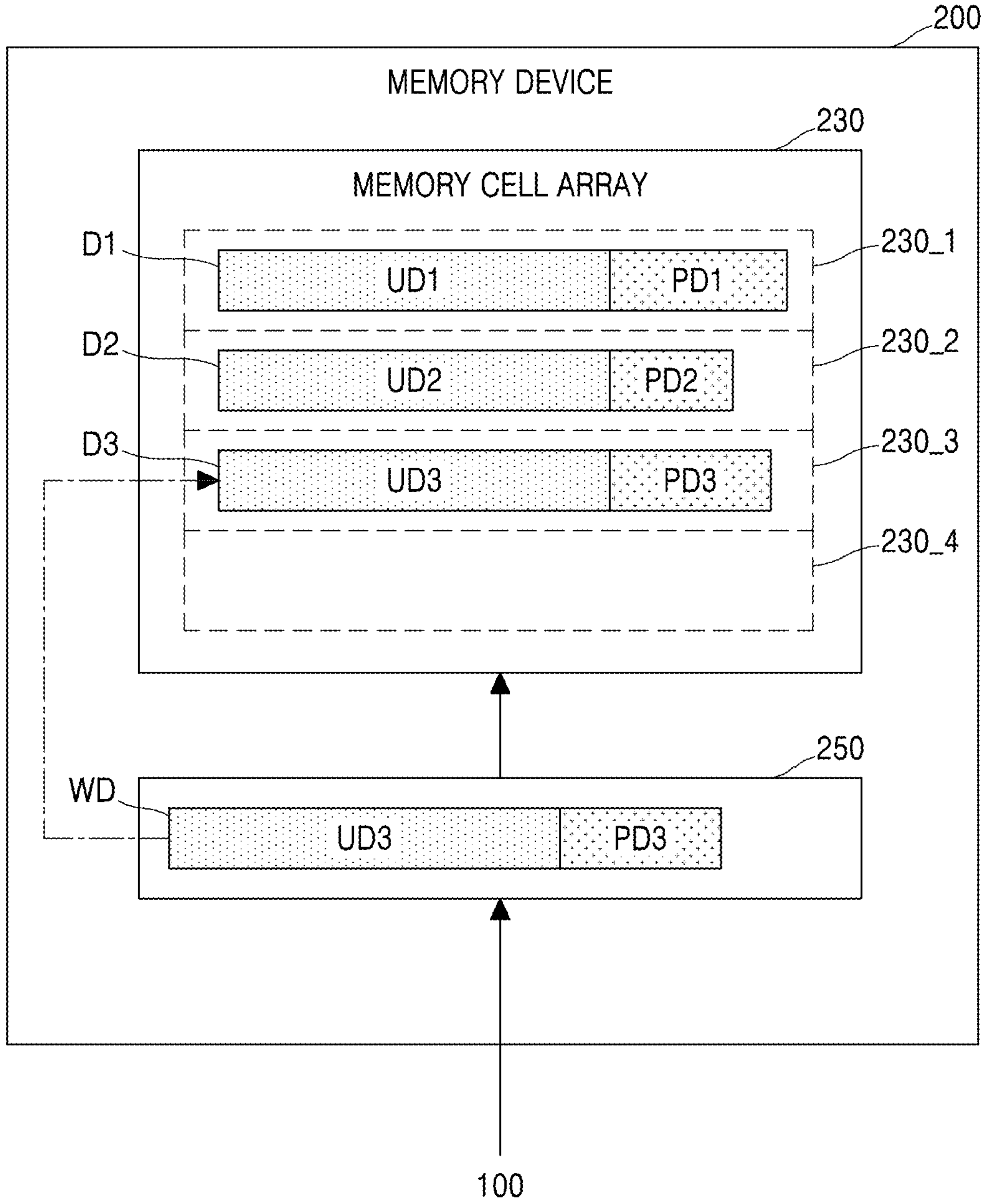
FIG. 5 is a block diagram illustrating a write operation on a memory device according to an embodiment.

FIG. 5 is a block diagram illustrating a write operation of the memory device 200 according to an embodiment. In detail, FIG. 5 is a diagram illustrating writing third data D3 into the third memory region 230_3. FIG. 5 may be described with reference to FIG. 4, and redundant descriptions may be omitted.

Referring to FIG. 5, the memory device 200 may include the memory cell array 230 and the page buffer 250. The memory cell array 230 may include the first memory region 230_1 to the fourth memory region 230_4. In FIG. 5, the memory cell array 230 is illustrated as including four memory regions, but this is an example, and the memory cell array 230 may include fewer or more memory regions.

First data D1 may be stored in the first memory region 230_1. The first data D1 may include first user data UD1 and first parity data PD1. Second data D2 may be stored in the second memory region 230_2. The second data D2 may include second user data UD2 and second parity data PD2. The third memory region 230_1 may be a memory region into which write data WD provided from the memory controller 100 is written. The fourth memory region 230_4 may be in a state in which no data is stored.

In an embodiment, the memory controller 100 may provide the write data WD to the memory device 200 during a write operation. The write data WD may include third user data UD3 and third parity data PD3. Here, the third parity data PD3 may be data generated by the memory controller 100 based on the third user data UD3. The memory device 200 may store write data D3 in the third memory region 230_3. Data stored in the third memory region 230_3 may be referred to as third data D3.

In an embodiment, formats and sizes of the first to third parity data PD1 to PD3 may be different. The formats and sizes of the first parity data PD1 to third parity data PD3 may be determined based on reliability information corresponding to the memory region in which each parity data is stored.

FIGS. 6A, 6B, 6C, and 6D are block diagrams illustrating a read operation of the memory device 200 according to an embodiment. FIGS. 6A, 6B, 6C, and 6D may be described with reference to FIGS. 1 to 4, and redundant descriptions may be omitted.

In an embodiment, the first data D1 may include first user data UD1 and first parity data PD1. The first parity data PD1 may be divided into a first parity region P1, a second parity region P2, and a third parity region P3. The memory controller 100 may perform error correction using data corresponding to each parity region, and each parity region may have different error correction capabilities. As an example, it is assumed that the error correction capability of the second parity region P2 is higher than the error correction capability of the first parity region P1, and the error correction capability of the third parity region P3 is the highest among the first to third parity regions P1 to P3. Dividing the parity data PD1 into three regions may be an example, and the first parity data PD1 may also be divided into fewer or more parity regions. Here, each parity region may be generated through a different ECC algorithm. For example, an ECC algorithm used to generate the first parity region P1 may be different from an ECC algorithm used to generate the second parity region P2.

Figure 6A:
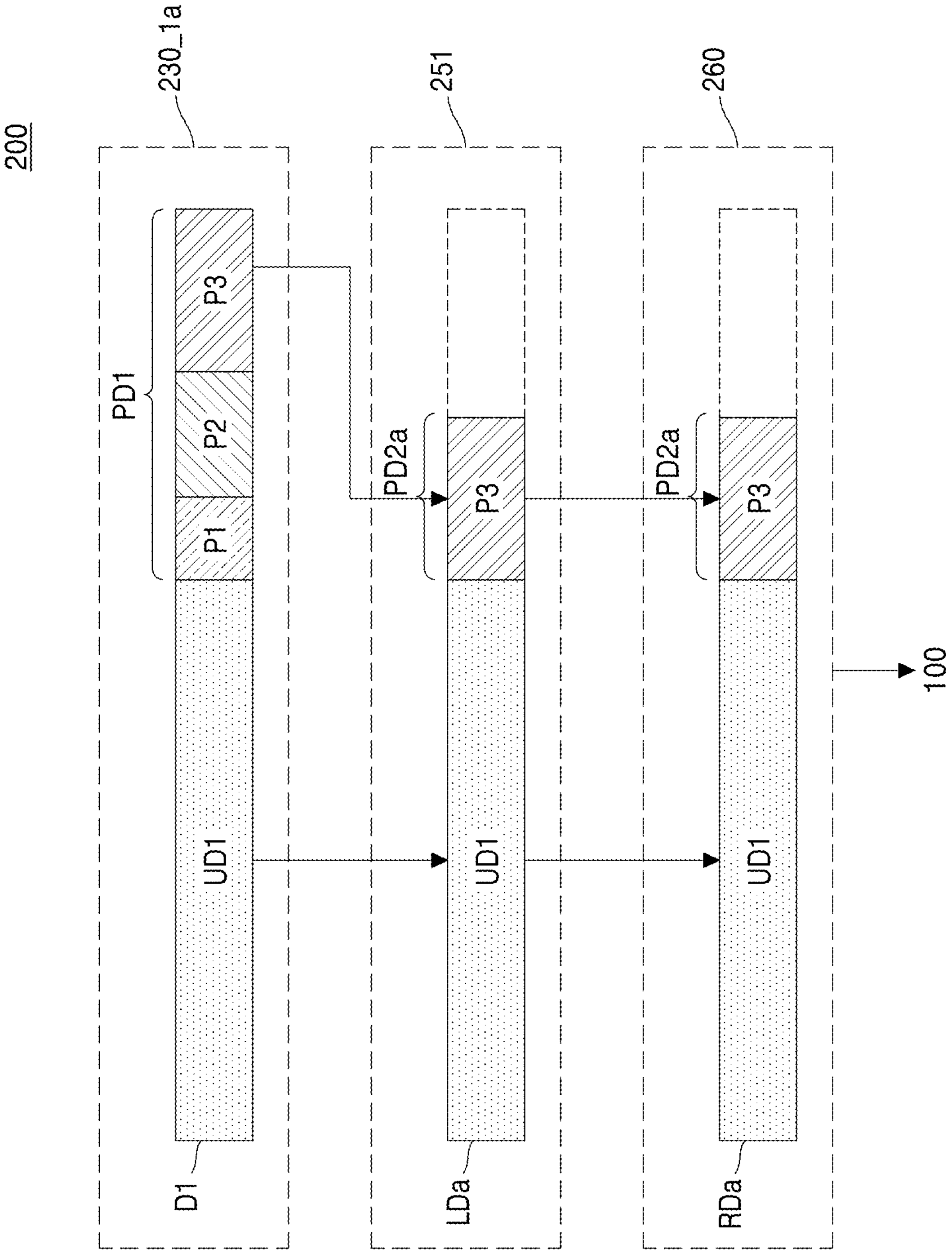
FIGS. 6A, 6B, 6C, and 6D are block diagrams illustrating a read operation of a memory device according to an embodiment.

FIG. 6A is a diagram illustrating reading first data D1 stored in a first memory region 230_1*a*. In FIG. 6A, it is assumed that the reliability information corresponding to the first memory region 230_1*a* is a first reference value, and the parity adjustment information PAI received from the memory controller 100 includes parity data format information indicating that a format of parity data to be read is a first format.

The memory device 200 may dump part of the first data D1 to the first latch 251 of the page buffer 250. Because the format of the parity data indicated by the parity adjustment information PAI is the first format, the memory device 200 may select only the third parity region P3 having the best error correction capability from the first parity data PD1 and dump the selected third parity region P3 to the first latch 251. Therefore, the first latch 251 may store latched data LDa including first user data UD1 and second parity data PD2*a*, and here, the second parity data PD2*a* may include the third parity region P3. In an embodiment, the second parity data PD2*a* may additionally include the second parity region P2 and/or the first parity region P1. The second parity data PD2*a* may be referred to as adjusted first parity data PD1.

The memory device 200 may provide the latched data LDa as read data RDa to the I/O circuit 260, and the I/O circuit 260 may provide the read data RDa to the memory controller 100. The memory controller 100 may perform an error correction operation on the first user data UD1 based on the second parity data PD2*a*.

Figure 6B:
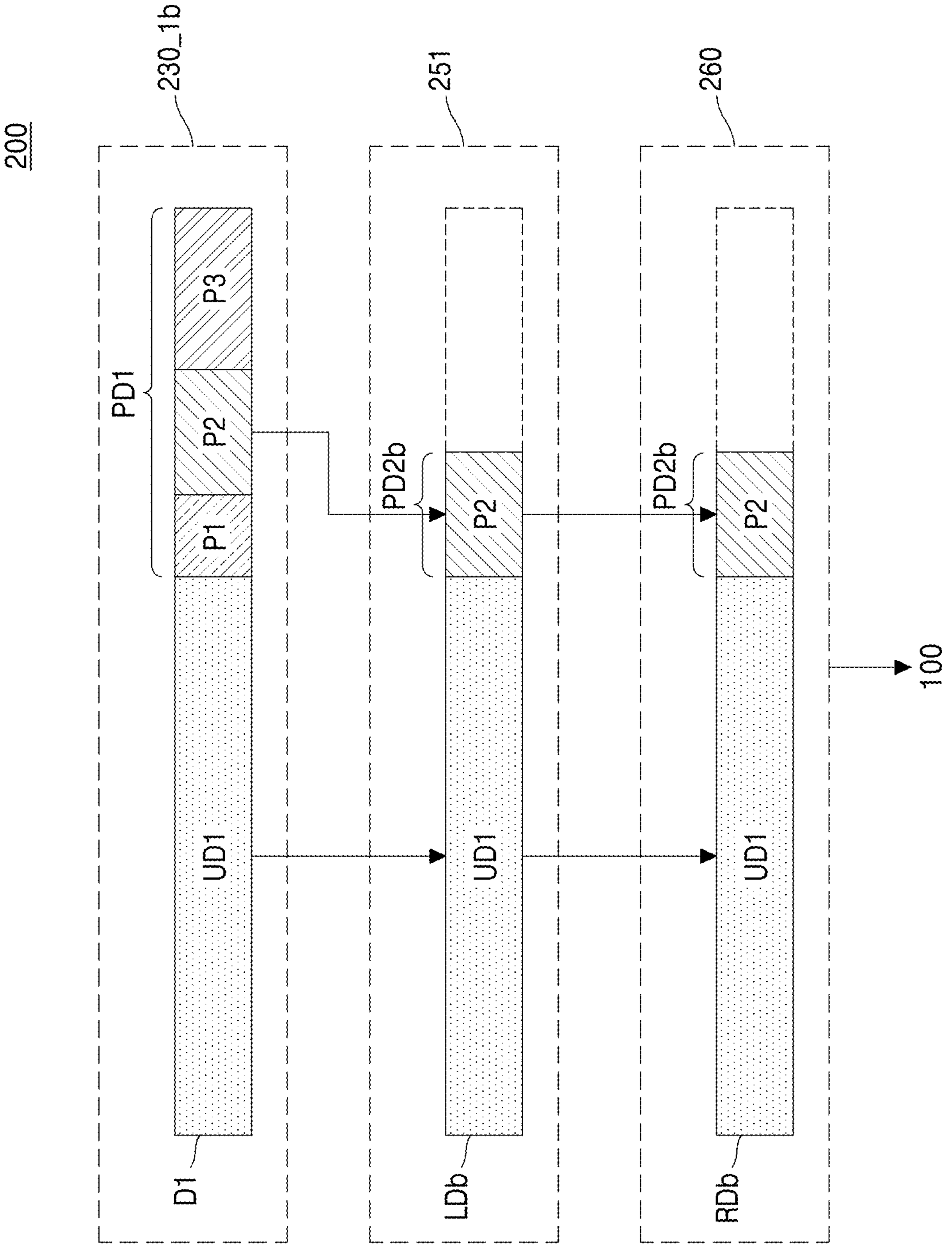

FIG. 6B is a diagram illustrating reading the first data D1 stored in a first memory region 230_1*b*. Referring to FIG. 6B, it is assumed that the reliability information corresponding to the first memory region 230_1*b* is a second reference value and the parity adjustment information PAI received from the memory controller 100 includes parity data format information indicating that the format of the parity data to be read is the second format.

In an embodiment, the memory device 200 may dump part of the first data D1 to the first latch 251. Because the format of the parity data indicated by the parity adjustment information PAI is the second format, the reliability of the memory region is high, so even if parity data having low error correction capability compared to parity data having the first format is used, the memory controller 100 may correct the error. For example, as shown in FIG. 6B, the memory device 200 may select the second parity region P2 from the first parity data PD1 and dump the selected parity region P2 into the first latch 251. The first latch 251 may store latched data LDb including first user data UD1 and second parity data PD2*b*, and in this case, the second parity data PD2*b* may include the second parity region P2. In an embodiment, the second parity data PD2*b* may additionally include the first parity region P1 and/or the third parity region P3. The second parity data PD2*b* may be referred to as adjusted first parity data PD1.

In FIG. 6B, the second parity region P2 as the second parity data PD2*b* is shown as being dumped to the first latch 251, but this is an example, and the first parity region P1 may be dumped to the first latch 251 as the second parity data PD2*b*. For example, if error correction is possible only with the first parity region P1 when the memory controller 100 performs an error correction operation, the first parity region P1 may be dumped to the first latch 251. In this case, the reliability of the first memory region 230_1*b* when the first parity region P1 is dumped to the first latch 251 may be higher than the reliability of the first memory region 230_1*b* when the second parity data P2 is dumped to the first latch 251. In this manner, whether the first parity region P1 or the second parity region P2 is dumped to the first latch 251 may be determined depending on the reliability of the first memory region 230_1*b*.

The memory device 200 may provide the latched data LDb as read data RDb to the I/O circuit 260, and the I/O circuit 260 may provide the read data RDb to the memory controller 100. The memory controller 100 may perform an error correction operation on the first user data UD1 based on the second parity data PD2*b*.

Figure 6C:
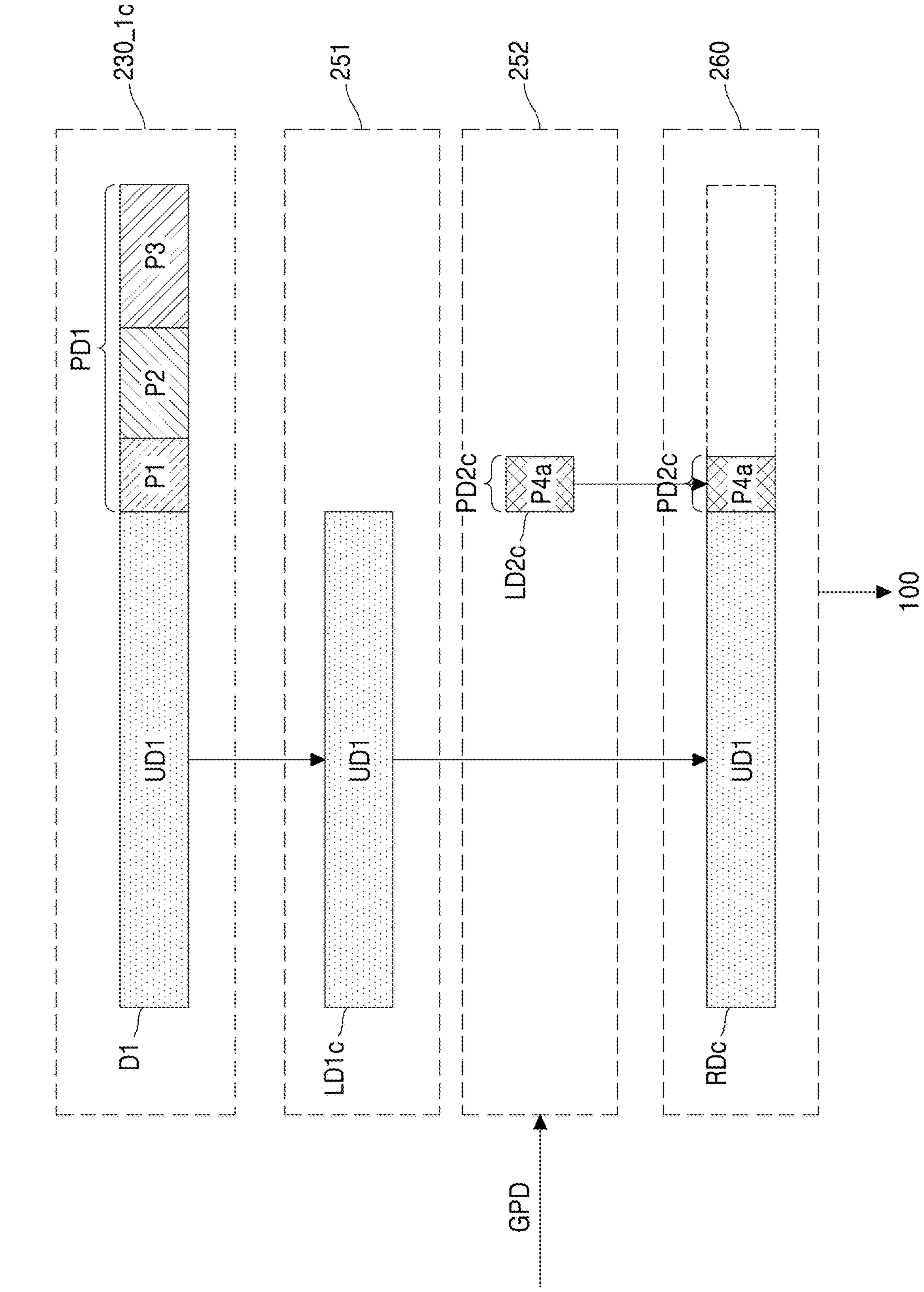

FIG. 6C is a diagram illustrating reading the first data D1 stored in a first memory region 230_1*c*. In FIG. 6C, it is assumed that the reliability information corresponding to a first memory region 230_1*c* is a third reference value and the parity adjustment information PAI received from the memory controller 100 includes parity data format information indicating that the format of parity data to be read is a third format. In addition, in FIG. 6C, it is assumed that the reliability of the first memory region 230_1*c* is very high, so the error correction capability required for the memory controller 100 is lower than the error correction capability achieved when the error correction operation based on the first parity region P1 is performed.

In an embodiment, because the format of the parity data is the third format according to the parity adjustment information PAI, the memory device 200 may dump the first user data UD1 of the first data D1 to the first latch 251. The memory device 200 may not dump the first parity data PD1 of the first data D1 to the first latch 251. Here, the control logic circuit 240 may generate parity data GPD generated based on the reliability information of the first memory region 230_1*c* and the first user data UD1 and provide the generated parity data GPD to the second latch 252 as second parity data PD2*c*. The second parity data PD2*c* may be generated based on the first user data UD1. Data dumped in the first latch 251 may be referred to as first latched data LD1*c*, and data dumped in the second latch 252 may be referred to as second latched data LD2*c*. In addition, the second parity data PD2*c* may be referred to as fourth parity region P4*a* to distinguish the second parity data PD2*c* from the first parity region P1 to the third parity region P3. The fourth parity region P4*a* may have a different size from those of the first to third parity regions P1 to P3. For example, the size of the fourth parity region P4*a* may be less than the size of the first parity region P1.

The memory device 200 may provide the first latched data LD1*c* and the second latched data LD2*c* as read data RDc to the I/O circuit 260, and the I/O circuit 260 may provide the read data RDc to the memory controller 100. The memory controller 100 may perform an error correction operation on the first user data UD1 based on the second parity data PD2*c*.

Figure 6D:
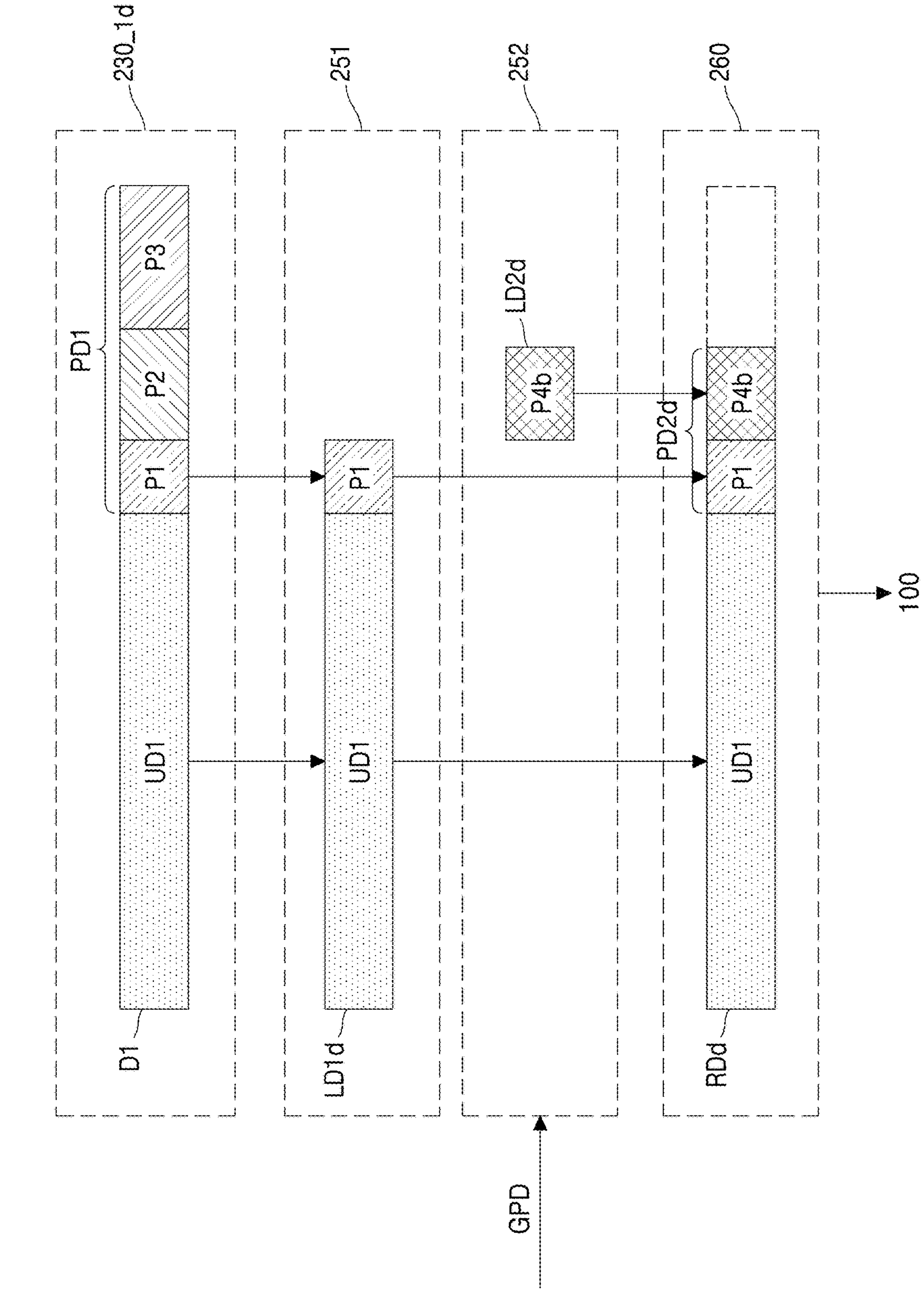

FIG. 6D is a diagram illustrating reading the first data D1 stored in a first memory region 230_1*d*. In FIG. 6D, it is assumed that the reliability information corresponding to a first memory region 230_1*d* is a third reference value and the parity adjustment information PAI received from the memory controller 100 includes parity data format information indicating that the format of parity data to be read is a third format. In addition, in FIG. 6D, it is assumed that the error correction capability considered by the memory controller 100 is between an error correction capability achieved when an error correction operation based on the first parity region P1 is performed and an error correction capability achieved when an error correction operation based on the second parity region P2 is performed.

In an embodiment, because the format of the parity data is the third format according to the parity adjustment information PAI, the memory device 200 may dump the first user data UD1 of the first data D1 to the first latch 251. The memory device 200 may dump part of the first parity data PD1 of the first data D1 to the first latch 251 as part of second parity data PD2*d*. Here, the control logic circuit 240 may generate parity data GPD based on the reliability information of the first memory region 230_1*d* and the first user data UD1 and may provide the generated parity data GPD to the second latch 252 as part of the second parity data PD2*d*. Data dumped to the first latch 251 may be referred to as first latched data LD1*d*, and data dumped to the second latch 252 may be referred to as second latched data LD2*d*. In addition, the second parity data PD2*d* may include a first parity region P1 and a fourth parity region P4*b*. The fourth parity region P4*b* of the second parity data PD2*d* may be data generated based on first user data UD1. The fourth parity region P4*b* may have a different size from those of the first to third parity regions P1 to P3. For example, the size of the fourth parity region P4*b* may be greater than the size of the first parity region P1 and less than the size of the second parity region P2.

The memory device 200 may provide data latched in the first latch 251 and the second latch 252 as read data RDd to the I/O circuit 260, and the I/O circuit 260 may provide the read data RDd to the memory controller 100. The memory controller 100 may perform an error correction operation on the first user data UD1 based on the second parity data PD2*d*. In an embodiment, the memory controller 100 may first perform an error correction operation based on the first parity region P1 included in the second parity data PD2*d*. Here, if the error correction operation based on the first parity region P1 fails, the memory controller 100 may perform an error correction operation based on the fourth parity region P4*b* included in the second parity data PD2*d*.

Although not shown in FIGS. 6A to 6D, in an embodiment, the memory device 200 may dump the parity regions P1 to P3 into the first latch 251.

Figure 7:
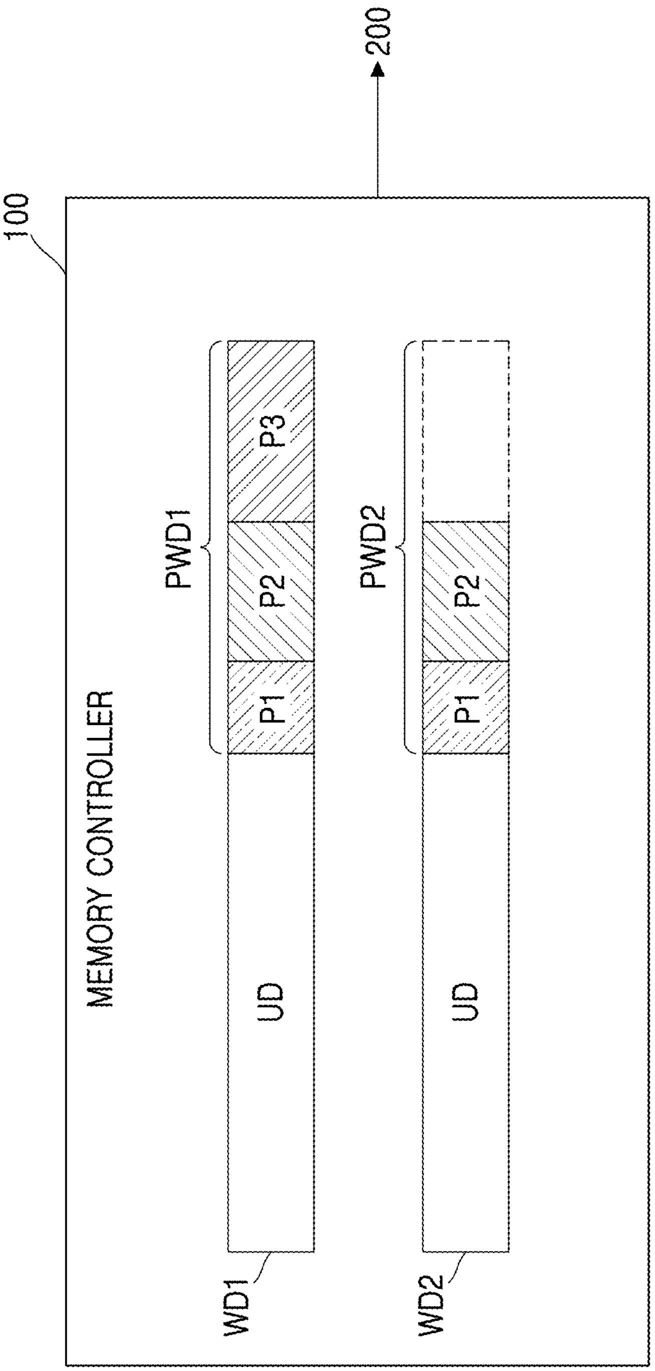
FIG. 7 is a block diagram illustrating a write operation on a memory device according to an embodiment.

FIG. 7 is a block diagram illustrating a write operation for the memory device 200 according to an embodiment. FIG. 7 may be described with reference to FIGS. 1 to 3 and FIG. 5, and redundant descriptions may be omitted.

FIG. 7 is a diagram to explain how the memory controller 100 writes data to the memory device 200.

The memory controller 100 may receive write data from the host. The write data may be divided into user data and parity data. The memory controller 100 may determine the format and size of parity data through the parity controller 160 according to reliability information of the memory region in which the write data is to be stored.

In an embodiment, it is assumed that the memory controller 100 stores first write data WD1 in the first memory region 230_1. When the reliability information for the first memory region 230_1 is the first write reference value, the parity controller 160 may determine that the format of the first parity data PWD1, which is the parity data of the first write data WD1, is the first write format. When the format of the first parity data PWD1 is the first write format, the first parity data PWD1 may be divided into the first parity region P1, the second parity region P2, and the third parity region P3. Dividing the first parity data PWD1 into three regions may be an example, and the first parity data PWD1 may also be divided into fewer or more parity regions. However, when the format of the parity data is the first write format, the parity data PWD1 may be divided into more parity regions than when the format of the parity data is the second write format.

In an embodiment, it is assumed that the memory controller 100 stores second write data WD2 in the first memory region 230_1. When the reliability information for the first memory region 230_1 is the second write reference value, the parity controller 160 may determine that the format of the second parity data PWD2, which is parity data of the second write data WD2, is the second write format. When the format of the second parity data PWD2 is the second write format, the second parity data PWD2 may be divided into a first parity region P1 and a second parity region P2. In detail, when the format of the parity data is the second write format, the parity data may be divided into fewer parity regions than when the format of the parity data is the first write format. Dividing the parity region of the second parity data PWD2 into the first parity region P1 and the second parity region P2 may be an example, and the parity region of the second parity data PWD2 may be divided into the first parity region P1 and the third parity region P3 or may be divided into the second parity region P2 and the third parity region P3. Alternatively, the second parity data PWD2 may include only one parity region among the first parity region P1 to the third parity region P3.

In an embodiment, an empty region in the second parity data PWD2 may not be filled with separate dummy data and may remain empty, when compared to the first parity data PWD1. The size of the second parity data PWD2 may be less than the size of the first parity data PWD1. Therefore, writing the second write data WD2 based on the second parity data PWD2 to the memory device 200 may have an I/O occupancy rate in the memory device 200 that is lower than that of writing the first write data WD1 based on the first parity data PWD1 to the memory device 200, and thus, the performance of the storage device 10 may be improved.

Figure 8:
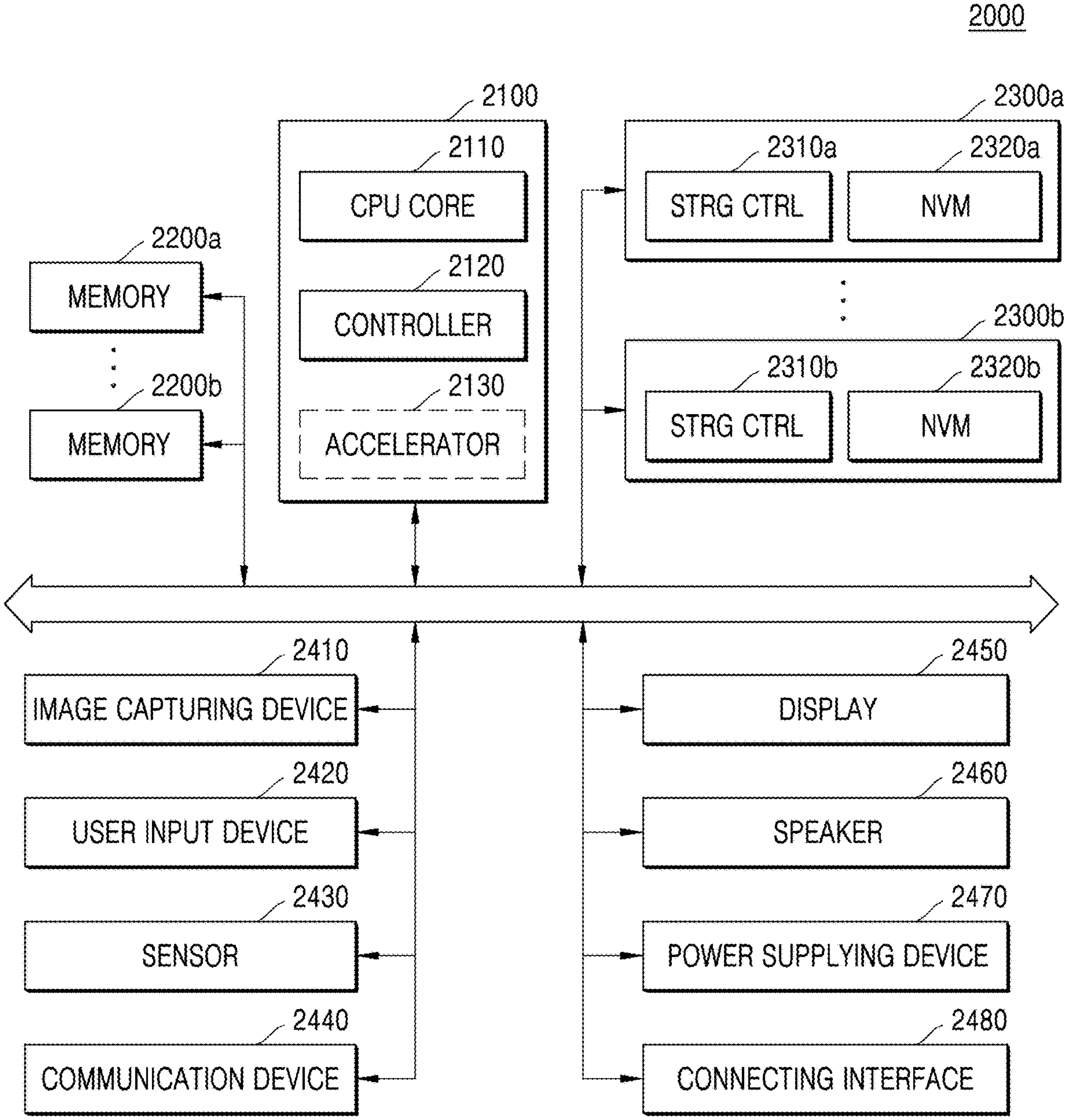
FIG. 8 is a diagram illustrating a system to which a storage device according to an embodiment is applied.

FIG. 8 is a diagram illustrating a system 2000 to which a storage device according to an embodiment is applied.

Referring to FIG. 8, the system 2000 of FIG. 8 may be basically a mobile system, such as a mobile phone, a smartphone, a tablet personal computer (PC), a wearable device, a healthcare device, or an Internet of things (IoT) device. However, the system 2000 of FIG. 8 is not limited to mobile systems, but may also include personal computers, laptop computers, servers, media players, or automotive devices, such as navigation devices.

Referring to FIG. 8, the system 2000 may include a main processor 2100, memories 2200*a* and 2200*b*, and storage devices 2300*a* and 2300*b* and may additionally include an image capturing device 2410, a user input device 2420, a sensor 2430, communication device 2440, a display 2450, a speaker 2460, a power supplying device 2470, and a connecting interface 2480.

The main processor 2100 may control the overall operation of the system 2000, and in detail, the main processor 2100 may control the operations of other components forming the system 2000. The main processor 2100 may be implemented as a general-purpose processor, a dedicated processor, or an application processor.

The main processor 2100 may include one or more CPU cores 2110 and may further include a controller 2120 for controlling the memories 2200*a* and 2200*b* and/or the storage devices 2300*a* and 2300*b*. According to an embodiment, the main processor 2100 may further include an accelerator 2130, which is a dedicated circuit for high-speed data computation, such as artificial intelligence (AI) data computation. Such an accelerator 2130 may include a graphics processing unit (GPU), a neural processing unit (NPU), and/or a data processing unit (DPU) and may also be implemented as a separate chip physically independent from other components of the main processor 2100.

The memories 2200*a* and 2200*b* may be used as main memory devices of the system 2000 and may include volatile memory, such as SRAM and/or DRAM, but may also include nonvolatile memory, such as flash memory, PRAM, and/or RRAM. The memories 2200*a* and 2200*b* may also be implemented in the same package as that of the main processor 2100.

The storage devices 2300*a* and 2300*b* may function as nonvolatile storage devices that store data regardless of whether power is supplied and may have a relatively large storage capacity compared to the memories 2200*a* and 2200*b*. The storage devices 2300*a* and 2300*b* may include storage controllers 2310*a* and 2310*b* and nonvolatile memories (NVMs) 2320*a* and 2320*b* that store data under control by the storage controllers 2310*a* and 2310*b*. The NVMs 2320*a* and 2320*b* may include flash memory having a 2-dimensional (2D) structure or a 3-dimensional (3D) vertical-NAND (V-NAND) structure but may also include other types of nonvolatile memories, such as PRAM and/or RRAM.

The storage devices 2300*a* and 2300*b* may be included in the system 2000 while being physically separated from the main processor 2100 or may be implemented in the same package as that of the main processor 2100. In addition, the storage devices 2300*a* and 2300*b* may have a form, such as a solid state device (SSD) or a memory card, and may be detachably coupled to other components of the system 2000 through an interface, such as the connecting interface 2480 to be described below. The storage devices 2300*a* and 2300*b* may be devices to which standard protocols, such as UFS, eMMC, or NVMe are applied, but are not limited thereto. In an embodiment, each of the storage devices 2300*a* and 2300*b* may be implemented using the storage device 10 of FIG. 1. In an embodiment, each of the storage controllers 2310*a* and 2310*b* may be implemented using the memory controller 100 of FIG. 1. In an embodiment, each of the NVMs 2320*a* and 2320*b* and each of the memories 2200*a* and 2200*b* may be implemented using one of the memory devices 200 of FIGS. 1, 3-5 and 6A to 6D.

The image capturing device 2410 may capture still images or moving images and may be a camera, camcorder, and/or webcam.

The user input device 2420 may receive various types of data input from a user of the system 2000, and may include a touch pad, keypad, keyboard, mouse and/or microphone.

The sensor 2430 may detect various types of physical quantities that may be obtained from the outside of the system 2000 and convert the detected physical quantities into electrical signals. The sensor 2430 may include a temperature sensor, a pressure sensor, an illumination sensor, a position sensor, an acceleration sensor, a biosensor, and/or a gyroscope sensor.

The communication device 2440 may transmit and receive signals to and from other devices outside the system 2000 according to various communication protocols. The communication device 2440 may be implemented to include an antenna, a transceiver, and/or a modem.

The display 2450 and the speaker 2460 may function as output devices that output visual information and auditory information, respectively, to the user of the system 2000.

The power supplying device 2470 may appropriately convert power supplied from a battery (not shown) built into the system 2000 and/or an external power source and supply power to each component of the system 2000.

The connecting interface 2480 may provide a connection between the system 2000 and an external device that is connected to the system 2000 and may exchange data with the system 2000. The connecting interface 2480 may be implemented in various interface methods, such as ATA, SATA, external SATA (e-SATA), SCSI, SAS, PCI, and PCIe, NVMe, IEEE 1394, USB, SD card, MMC, eMMC, UFS, embedded universal flash storage (UFS), compact flash (CF) card, etc.

Figure 9:
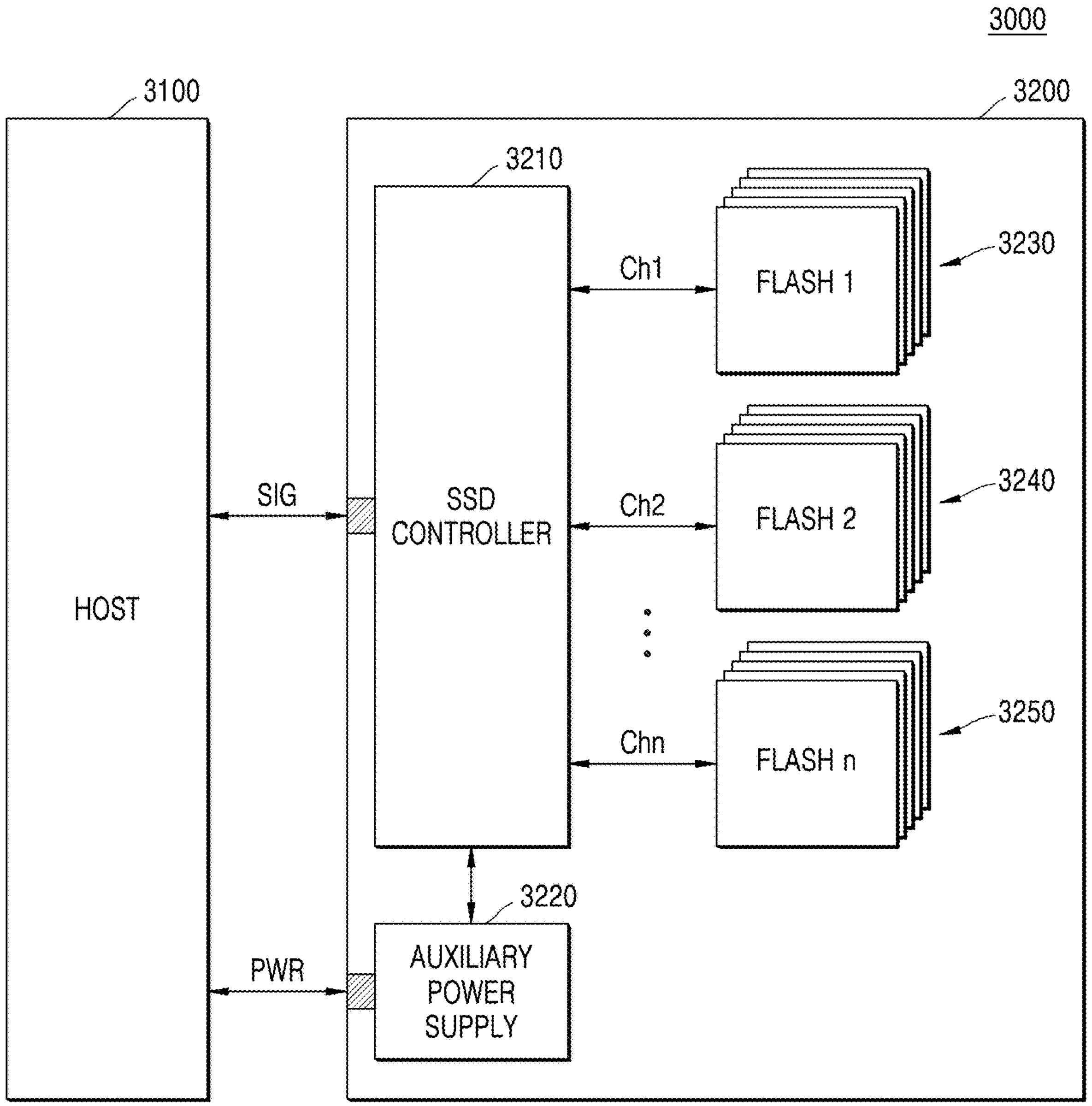
FIG. 9 is a block diagram illustrating an example in which a memory controller according to an embodiment is applied to a solid-state drive (SSD) system.

FIG. 9 is a block diagram illustrating an example of applying a memory controller according to an embodiment to the SSD system 2000.

Referring to FIG. 9, an SSD system 3000 may include a host 3100 and an SSD 3200. The SSD 3200 may exchange signals with the host 3100 through a signal connector and may receive power through a power connector. The SSD 3200 may include an SSD controller 3210, an auxiliary power supply 3220, and memory devices (e.g., flash memories) 3230, 3240, and 3250. Here, the SSD 3200 may be implemented using the storage device 10 of FIG. 1. In an embodiment, the SSD controller 3210 may be implemented using the memory controller 100 of FIG. 1. In an embodiment, each of the memory devices 3230, 3240, and 3250 may be implemented using one of the memory devices 200 of FIGS. 1, 3-5 and 6A to 6D.

While the inventive concept has been particularly shown and described with reference to embodiments thereof, it will be understood that various changes in form and details may be made therein without departing from the spirit and scope of the present invention as set forth in the following claims.

What is claimed is:

1. A memory device comprising:

a memory cell array including a first memory region storing first data;

a page buffer connected to the memory cell array and including a first latch configured to store data read from the memory cell array; and a control logic circuit configured to receive parity adjustment information from an external device and control an operation of the memory cell array, wherein the first data includes first user data and first parity data including parity bits generated based on the first user data, wherein the control logic circuit is configured to adjust a size of the first parity data, based on the parity adjustment information, and dump the adjusted first parity data to the first latch, and wherein the size of the first parity data dumped to the first latch varies depending on a format of the first parity data indicated by the parity adjustment information.

2. The memory device of claim 1, wherein:

the memory cell array further includes a second memory region including second data, the second data includes second user data and second parity data including parity bits generated based on the second user data, and a size of the first parity data is different from a size of the second parity data.

3. The memory device of claim 1, wherein:

the first parity data includes a first parity region, a second parity region and a third parity region having sizes different from each other.

4. The memory device of claim 3, wherein, when the format of the first parity data is a first format, the memory device is configured such that the control logic circuit dumps at least parity bits included in the third parity region to the first latch.

5. The memory device of claim 3, wherein, when the format of the first parity data is a second format, the memory device is configured such that the control logic circuit dumps parity bits included in at least one of the first and second parity regions to the first latch.

6. The memory device of claim 3, wherein:

the control logic circuit further includes a parity generator configured to generate third parity data different from the first parity data, and the page buffer further includes a second latch configured to store the third parity data generated from the parity generator.

7. The memory device of claim 6, wherein, when the format of the first parity data is a third format, the memory device is configured such that the control logic circuit generates the third parity data through the parity generator and dumps the third parity data to the second latch.

8. The memory device of claim 7, wherein the third parity data is generated based on the first user data.

9. The memory device of claim 6, further comprising:

an input/output circuit configured to transmit data stored in the first latch and the second latch to the external device in response to a read command received from the external device.

10. The memory device of claim 1, wherein the parity adjustment information includes information indicating a format and size of parity data related to the first memory region and is generated based on reliability information of the first memory region.

11. A storage device comprising:

a memory device configured to adjust a size of first parity data, based on parity adjustment information, and output the first parity data having the adjusted size; and a memory controller configured to control an operation of the memory device, wherein the memory device includes:

a memory cell array including a plurality of memory regions;

a page buffer connected to the memory cell array and including a first latch configured to store data read from the memory cell array; and a control logic circuit configured to receive the parity adjustment information from the memory controller and control an operation of the memory cell array, and wherein the memory controller includes:

a parity controller including reliability information which includes information indicating reliability of the plurality of memory regions included in the memory device, and the parity controller configured to:

determine a format and the size of the first parity data, based on the reliability information of a memory region in which user data corresponding to the first parity data is to be stored, and provide the parity adjustment information indicating the determined format and size of the first parity data to the memory device.

12. The storage device of claim 11, wherein:

the first parity data includes a first parity region, a second parity region and a third parity region having sizes different from each other, and a size of the first parity data dumped to the first latch varies depending on a format of the first parity data indicated by the parity adjustment information.

13. The storage device of claim 12, wherein, when the format of the first parity data is a first format, the storage device is configured such that the memory device dumps at least parity bits included in the third parity region to the first latch.

14. The storage device of claim 12, wherein, when the format of the first parity data is a second format, the storage device is configured such that the memory device dumps parity bits included in at least one of the first and second parity regions to the first latch.

15. The storage device of claim 12, wherein:

the control logic circuit further includes a parity generator configured to generate second parity data different from the first parity data, and the page buffer includes a second latch configured to store the second parity data generated from the parity generator.

16. The storage device of claim 15, wherein, when the format of the first parity data is a third format, the storage device is configured such that the memory device generates the second parity data through the parity generator and dumps the second parity data to the second latch.

17. The storage device of claim 16, wherein the second parity data is generated based on the user data.

* * * * *